US012355021B2

(12) United States Patent
Kanaya et al.

(10) Patent No.: US 12,355,021 B2
(45) Date of Patent: Jul. 8, 2025

(54) DISPLAY DEVICE

(71) Applicant: Japan Display Inc., Tokyo (JP)

(72) Inventors: Yasuhiro Kanaya, Tokyo (JP); Masanobu Ikeda, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 18/583,038

(22) Filed: Feb. 21, 2024

(65) Prior Publication Data

US 2024/0194659 A1      Jun. 13, 2024

Related U.S. Application Data

(63) Continuation of application No. 17/104,850, filed on Nov. 25, 2020, now Pat. No. 11,916,051, which is a continuation of application No. PCT/JP2019/017102, filed on Apr. 22, 2019.

(30) Foreign Application Priority Data

May 31, 2018   (JP) .................. 2018-105503

(51) Int. Cl.
  *H01L 27/14*    (2006.01)
  *H01L 25/16*    (2023.01)
  *H01L 29/04*    (2006.01)
  *H01L 29/15*    (2006.01)
  *H01L 31/036*   (2006.01)
  *H10H 20/857*   (2025.01)
  *G09G 3/32*     (2016.01)

(52) U.S. Cl.
  CPC ......... *H01L 25/167* (2013.01); *H10H 20/857* (2025.01); *G09G 3/32* (2013.01)

(58) Field of Classification Search
  CPC ..... H01L 33/00–648; H01L 27/15–156; H01L 2933/00–0091; H01L 2933/0016; H01L 2933/0066; H01L 25/167; G09G 3/32
  See application file for complete search history.

(56) References Cited

U.S. PATENT DOCUMENTS

| | | | |
|---|---|---|---|
| 11,430,840 B2* | 8/2022 | Kang | ................... H10K 59/131 |
| 2017/0068382 A1* | 3/2017 | Choi | ..................... G06F 3/0448 |
| 2018/0097047 A1* | 4/2018 | Jung | ................ H10K 59/80522 |
| 2018/0175268 A1* | 6/2018 | Moon | ................. H01L 25/0753 |

OTHER PUBLICATIONS

German Office Action dated dated Apr. 30, 2024 for corresponding DE application No. 112019002 237.7 (5 pages).
Office Action dated Dec. 18, 2023 for corresponding German application No. 112019002237.7 (13 pages).

* cited by examiner

*Primary Examiner* — Ismail A Muse
(74) *Attorney, Agent, or Firm* — K&L Gates LLP

(57) ABSTRACT

A display device including a substrate, a plurality of pixels, a plurality of inorganic light-emitting elements, a flattening film, and an inorganic film. The pixels are arrayed on the substrate and display different colors. The inorganic light-emitting elements are provided to the respective pixels. The flattening film surrounds at least a side surface of the inorganic light-emitting element. The inorganic film covers the flattening film and the inorganic light-emitting element. The upper surface of the inorganic light-emitting element is exposed from the flattening film and is in contact with the inorganic film. Alternatively, the flattening film is provided covering the upper surface of the inorganic light-emitting element.

8 Claims, 15 Drawing Sheets

DISPLAY DEVICE

CROSS-REFERENCE TO RELATED APPLICATION(S)

This application is a continuation of U.S. patent application Ser. No. 17/104,850 filed on Nov. 25, 2020, which application is a continuation of PCT international application Ser. No. PCT/JP2019/017102 filed on Apr. 22, 2019 which designates the United States, incorporated herein by reference, and which claims the benefit of priority from Japanese Patent Application No. 2018-105503, filed on May 31, 2018, incorporated herein by reference.

BACKGROUND

1. Technical Field

The present disclosure relates to a display device.

2. Description of the Related Art

Inorganic electroluminescent (EL) displays provided with inorganic light-emitting diodes (micro LEDs) serving as display elements have recently been attracting attention (for example, refer to Japanese Translation of PCT International Application Publication No. 2017-529557). In inorganic EL displays, a plurality of light-emitting elements that output light in different colors are arrayed on an array substrate. Inorganic EL displays do not require any light source because they are provided with self-emitting elements and have higher light use efficiency because light is output without passing through a color filter. Inorganic EL displays have higher environmental resistance than organic EL displays provided with organic light-emitting diodes (OLEDs) serving as display elements.

If moisture enters into inorganic light-emitting elements in inorganic EL displays, it may possibly cause corrosion in various kinds of electrodes, wiring, and other components coupled to the inorganic light-emitting elements. In display devices provided with inorganic LEDs, entry of moisture may possibly decrease luminous efficiency, thereby deteriorating display characteristics.

SUMMARY

A display device according to an embodiment of the present disclosure comprising: a substrate; a plurality of pixels arrayed on the substrate and configured to display different colors; an inorganic light-emitting element provided to each of the pixels; a flattening film that surrounds at least a side surface of the inorganic light-emitting element; and an inorganic film that covers the flattening film and the inorganic light-emitting element.

DETAILED DESCRIPTION OF THE PREFERRED EMBODIMENTS

Figure 1:
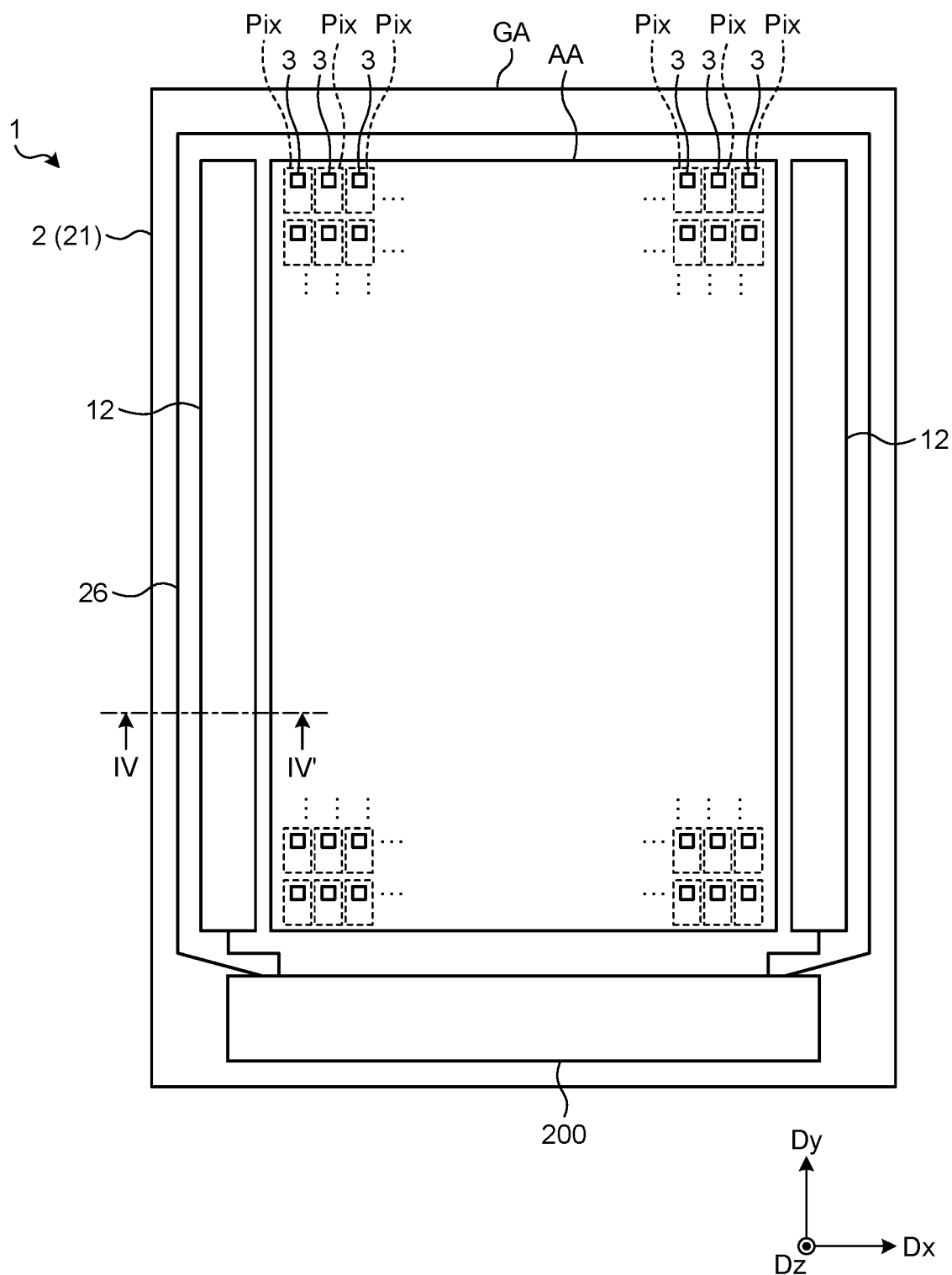
FIG. 1 is a plan view schematically illustrating a display device according to a first embodiment.

Exemplary aspects (embodiments) to embody the present disclosure are described below in greater detail with reference to the accompanying drawings. The contents described in the embodiments are not intended to limit the present disclosure. Components described below include components easily conceivable by those skilled in the art and components substantially identical therewith. Furthermore, the components described below may be appropriately combined. What is disclosed herein is given by way of example only, and appropriate changes made without departing from the spirit of the present disclosure and easily conceivable by those skilled in the art naturally fall within the scope of the disclosure. To simplify the explanation, the drawings may possibly illustrate the width, the thickness, the shape, and other elements of each unit more schematically than the actual aspect. These elements, however, are given by way of example only and are not intended to limit interpretation of the present disclosure. In the present specification and the figures, components similar to those previously described with reference to previous figures are denoted by like reference numerals, and detailed explanation thereof may be appropriately omitted.

First Embodiment

FIG. 1 is a plan view schematically illustrating a display device according to a first embodiment. As illustrated in FIG. 1, a display device 1 includes an array substrate 2, a plurality of pixels Pix, drive circuits 12, a drive integrated circuit (IC) 200, and cathode wiring 26. The array substrate 2 is a drive circuit board for driving the pixels Pix and is also called a backplane or an active matrix substrate. The array substrate 2 is provided with a substrate 21, first transistors Tr1, second transistors Tr2, transistors TrG (refer to FIG. 4), and various kinds of wiring, for example. The first transistors Tr1, the second transistors Tr2, and other transistors are switching elements provided to the respective pixels Pix. The transistors TrG are switching elements included in the drive circuits 12.

As illustrated in FIG. 1, the display device 1 has a display region AA and a peripheral region GA. The display region AA is provided overlapping the pixels Pix and displays an image. The peripheral region GA does not overlap the pixels Pix and is disposed outside the display region AA.

The pixels Pix are arrayed in a first direction Dx and a second direction Dy in the display region AA of the substrate 21. The pixels Pix each include a light-emitting element 3. The display device 1 displays an image by outputting light in different colors from the respective light-emitting elements 3. The light-emitting element 3 is an inorganic light-emitting diode (LED) chip having a size of approximately 3 µm to 300 µm in planar view and is called a micro LED. A display device including the micro LEDs in the respective pixels is also called a micro LED display device. The term "micro" of the micro LED is not intended to limit the size of the light-emitting element 3.

The first direction Dx and the second direction Dy are parallel to the surface of the substrate 21. The first direction Dx is orthogonal to the second direction Dy. The first direction Dx may intersect the second direction Dy without being orthogonal thereto. A third direction Dz is orthogonal to the first direction Dx and the second direction Dy.

The drive circuits 12 drive a plurality of gate lines (first gate lines GCL1 and second gate lines GCL2 (refer to FIG. 3)) based on various control signals received from the drive IC 200. The drive circuits 12 sequentially or simultaneously select a plurality of gate lines and supply gate drive signals to the selected gate lines. As a result, the drive circuits 12 select a plurality of pixels Pix coupled to the gate lines.

The drive IC 200 is a circuit that controls display on the display device 1. The drive IC 200 is mounted on the peripheral region GA of the substrate 21 by chip-on-glass (COG) bonding. The mounting form of the drive IC 200 is not limited thereto, and the drive IC 200 may be mounted on FPCs or a rigid substrate coupled to the peripheral region GA of the substrate 21 by chip-on-film (COF) bonding.

The cathode wiring 26 is provided in the peripheral region GA of the substrate 21. The cathode wiring 26 is provided surrounding the pixels Pix in the display region AA and the drive circuits 12 in the peripheral region GA. Cathodes of a plurality of light-emitting elements 3 are coupled to the common cathode wiring 26 and supplied with a ground potential, for example.

Figure 2:
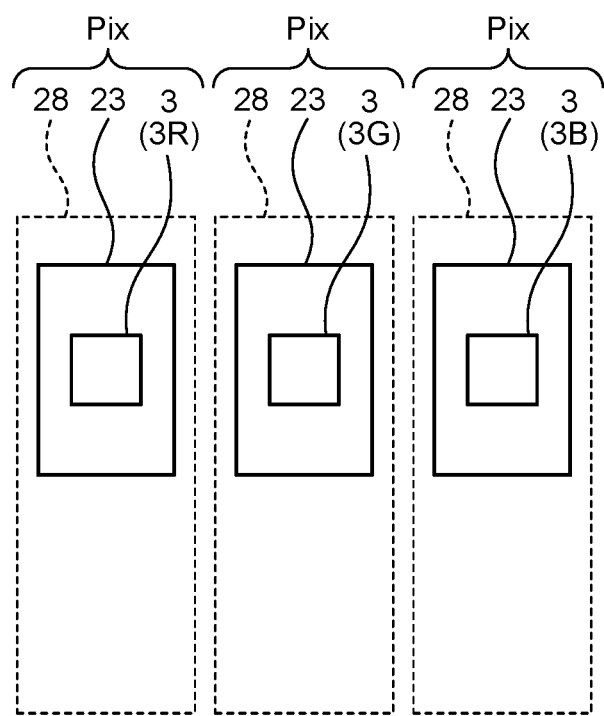
FIG. 2 is a plan view of a plurality of pixels.

FIG. 2 is a plan view of a plurality of pixels. As illustrated in FIG. 2, the pixels Pix each include the light-emitting element 3, a second electrode 23, and a pixel circuit 28. The light-emitting elements 3 are provided corresponding to the respective pixels Pix and include first light-emitting elements 3R, second light-emitting elements 3G, and third light-emitting elements 3B that output light in different colors. The first light-emitting element 3R outputs red light. The second light-emitting element 3G outputs green light. The third light-emitting element 3B outputs blue light. In the following description, the first light-emitting element 3R, the second light-emitting element 3G, and the third light-emitting element 3B are simply referred to as the light-emitting elements 3 when they need not be distinguished from one another. The light-emitting elements 3 may output light in four or more different colors.

The pixel Pix including the first light-emitting element 3R, the pixel Pix including the second light-emitting element 3G, and the pixel Pix including the third light-emitting element 3B are repeatedly arrayed in this order in the first direction Dx. In other words, the first light-emitting element 3R, the second light-emitting element 3G, and the third light-emitting element 3B are repeatedly arrayed in this order in the first direction Dx. The first light-emitting elements 3R, the second light-emitting elements 3G, and the third light-emitting elements 3B are each arrayed in the second direction Dy. In other words, in the example illustrated in FIG. 2, the light-emitting elements 3 are each disposed side by side with other light-emitting elements 3 that output light in different colors in the first direction Dx. The light-emitting elements 3 are each disposed side by side with other light-emitting elements 3 that output light in the same color in the second direction Dy.

Figure 3:
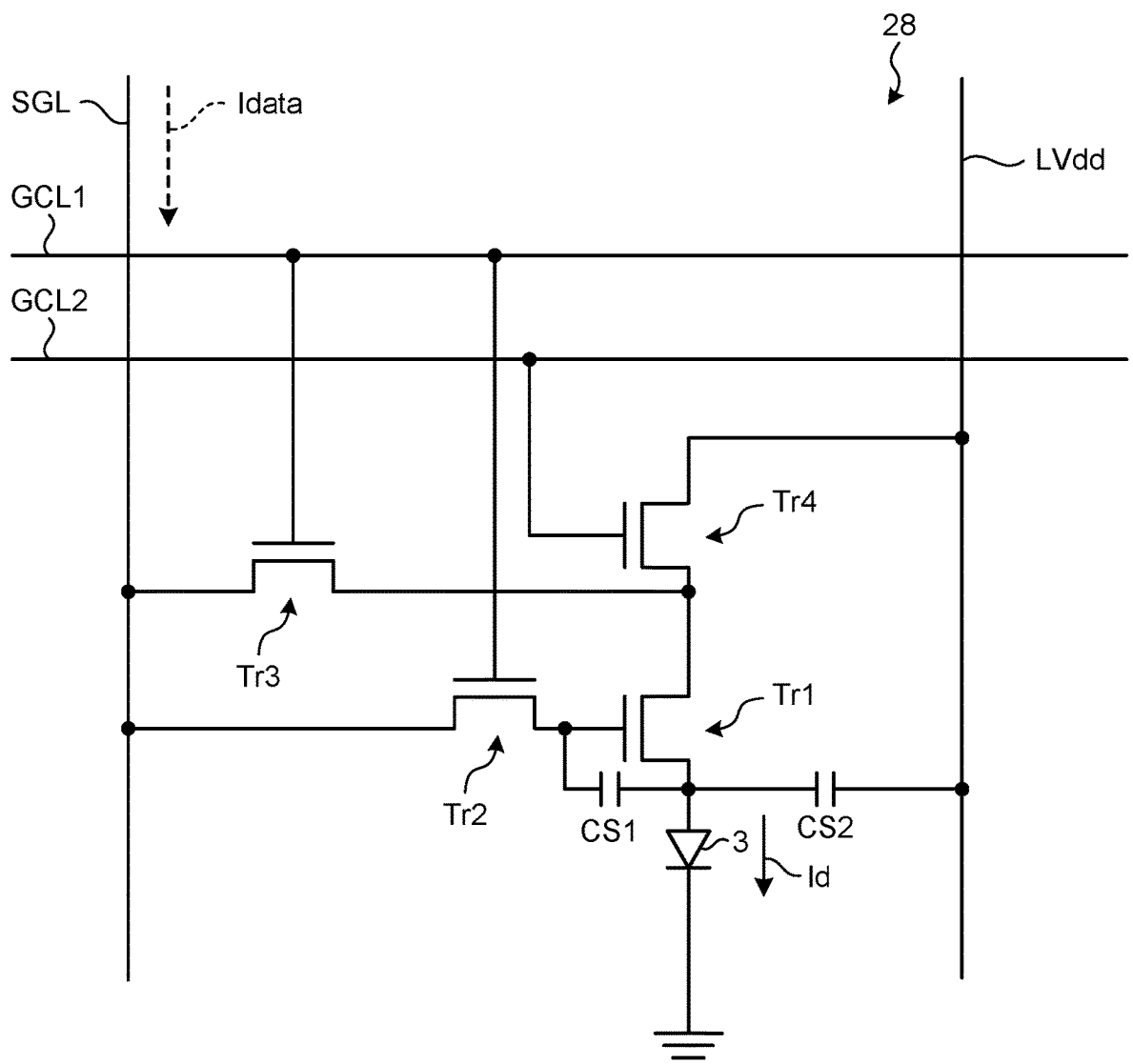
FIG. 3 is a circuit diagram of a pixel circuit.

FIG. 3 is a circuit diagram of the pixel circuit. The pixel circuit 28 is a drive circuit that drives the light-emitting element 3. As illustrated in FIG. 3, the pixel circuit 28 includes a plurality of switching elements (the first transistor Tr1, the second transistor Tr2, a third transistor Tr3, and a fourth transistor Tr4), the first gate line GCL1, the second gate line GCL2, a signal line SGL, and a power-supply line LVdd. The transistors are thin-film transistors (TFTs).

The first transistor Tr1 is a drive TFT. The second transistor Tr2 is a switching TFT for switching a light-emission period and a non-light-emission period. The third transistor Tr3 and the fourth transistor Tr4 are current switching TFTs. The signal line SGL is coupled to a constant current source. The power-supply line LVdd is coupled to a constant voltage source.

Holding capacitance CS1 is formed between the drain of the second transistor Tr2 and the anode of the light-emitting element 3. Holding capacitance CS2 is formed between the anode of the light-emitting element 3 and the power-supply line LVdd. With the holding capacitance CS1 and CS2, the pixel circuit 28 can prevent fluctuations in a gate voltage due to parasitic capacitance and current leakage of the second transistor Tr2.

In the non-light-emission period, the drive circuits 12 (refer to FIG. 1) switch the electric potential of the first gate line GCL1 to the high level and switch the electric potential of the second gate line GCL2 to the low level. As a result, the second transistor Tr2 and the third transistor Tr3 are turned ON, and the fourth transistor Tr4 is turned OFF. The anode of the light-emitting element 3 is supplied with an electric current Idata from the signal line SGL.

In the light-emission period, the drive circuits 12 (refer to FIG. 1) switch the electric potential of the first gate line GCL1 to the low level and switch the electric potential of the second gate line GCL2 to the high level. As a result, the second transistor Tr2 and the third transistor Tr3 are turned OFF, and the fourth transistor Tr4 is turned ON. The anode of the light-emitting element 3 is supplied with an electric current Id from the power-supply line LVdd. The configuration illustrated in FIG. 3 is given by way of example only, and the configuration of the pixel circuit 28 and the operations of the display device 1 may be appropriately modified.

Figure 4:
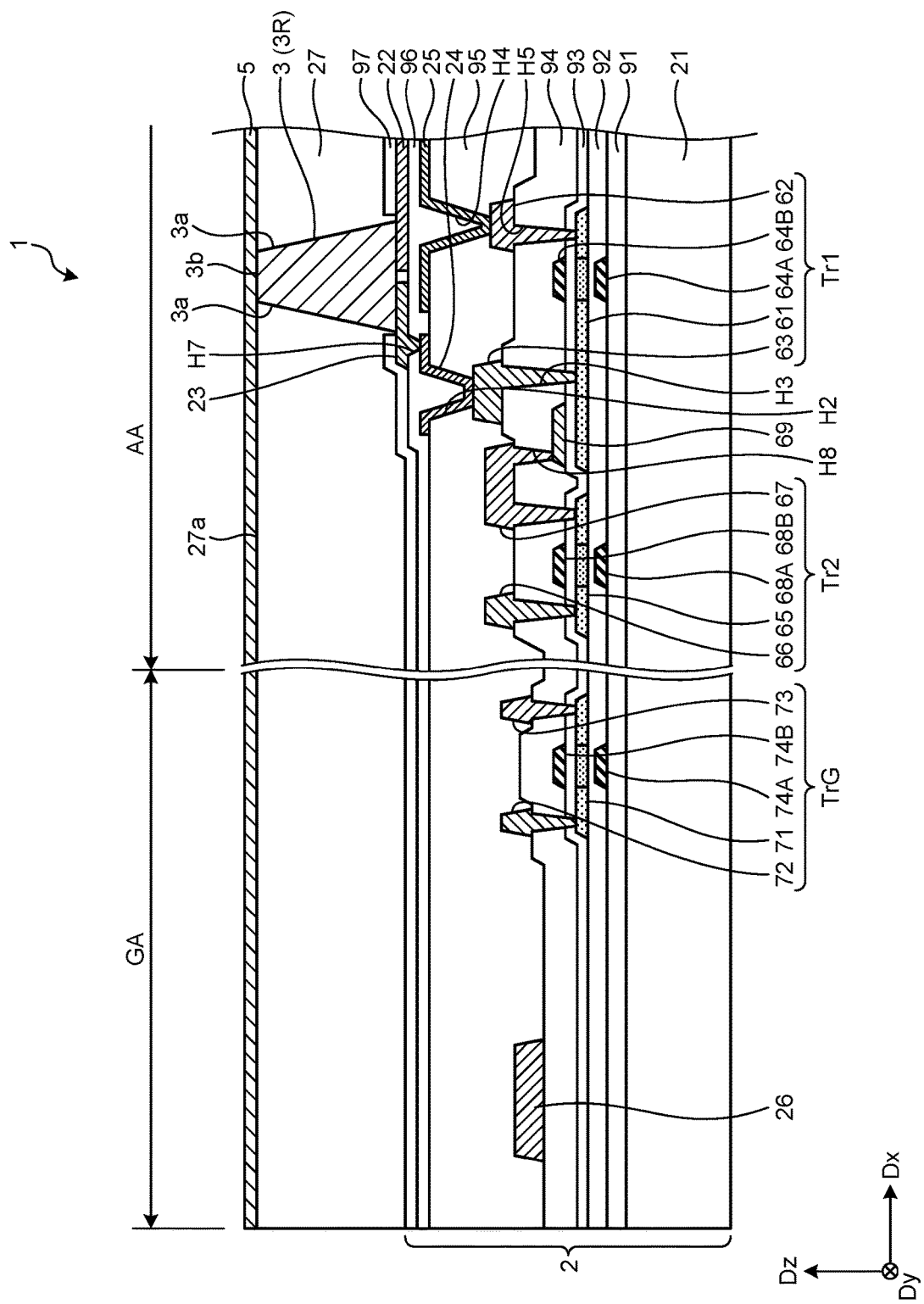
FIG. 4 is a sectional view along line IV-IV' of FIG. 1.

FIG. 4 is a sectional view along line IV-IV' of FIG. 1. As illustrated in FIG. 4, the light-emitting element 3 is provided on the array substrate 2. The array substrate 2 includes the substrate 21, the switching elements, such as the first transistors Tr1 and the second transistors Tr2, various kinds of wiring, and various insulating films. In the peripheral region GA of the substrate 21, the transistors TrG included in the drive circuits 12 are provided as a plurality of transistors. The substrate 21 is an insulating substrate and is a glass substrate, a resin substrate, or a resin film, for example.

In the present specification, a direction from the substrate 21 to an upper surface 27a of a flattening film 27 in a direction perpendicular to the surface of the substrate 21 is referred to as an "upper side". A direction from the upper surface 27a of the flattening film 27 to the substrate 21 is referred to as a "lower side". The "planar view" indicates a view seen from the direction perpendicular to the surface of the substrate 21.

The first transistors Tr1, the second transistors Tr2, and the transistors TrG are provided on a first surface of the substrate 21. The first transistor Tr1 includes a semiconductor 61, a source electrode 62, a drain electrode 63, a first gate electrode 64A, and a second gate electrode 64B. The first gate electrode 64A is provided on the substrate 21 with a first insulating film 91 interposed therebetween. The insulating films, including the first insulating film 91, are made of inorganic insulating material, such as a silicon oxide film (SiO), a silicon nitride film (SiN), and a silicon oxynitride film (SiON). The inorganic insulating films are not limited to single layers and may be multilayered films.

A second insulating film 92 is provided on the first insulating film 91 to cover the first gate electrode 64A. The semiconductor 61 is provided on the second insulating film 92. A third insulating film 93 is provided on the second insulating film 92 to cover the semiconductor 61. The second gate electrode 64B is provided on the third insulating film 93. The semiconductor 61 is provided between the first gate electrode 64A and the second gate electrode 64B in the direction perpendicular to the substrate 21 (hereinafter, referred to as the third direction Dz). In the semiconductor 61, a channel region is formed at a part between the first gate electrode 64A and the second gate electrode 64B.

In the example illustrated in FIG. 4, the first transistor Tr1 has what is called a dual-gate structure. The first transistor Tr1 may have a bottom-gate structure including the first gate electrode 64A and not including the second gate electrode 64B. Alternatively, the first transistor Tr1 may have a top-gate structure including the second gate electrode 64B alone and not including the first gate electrode 64A.

The semiconductor 61 is made of amorphous silicon, microcrystalline oxide semiconductor, amorphous oxide semiconductor, polycrystalline silicon, low-temperature polycrystalline silicon (LTPS), or gallium nitride (GaN), for example. Examples of the oxide semiconductor include, but are not limited to, IGZO, zinc oxide (ZnO), ITZO, etc. IGZO is indium gallium zinc oxide, and ITZO is indium tin zinc oxide.

A fourth insulating film 94 is provided on the third insulating film 93 to cover the second gate electrode 64B. The source electrode 62 and the drain electrode 63 are provided on the fourth insulating film 94. The source electrode 62 according to the present embodiment is electrically coupled to the semiconductor 61 through a contact hole H5. The drain electrode 63 is electrically coupled to the semiconductor 61 through a contact hole H3.

A fifth insulating film 95 is provided on the fourth insulating film 94 to cover the source electrode 62 and the drain electrode 63. The fifth insulating film 95 is a flattening film that flattens unevenness formed by the first transistor Tr1 and the various kinds of wiring.

The second transistor Tr2 includes a semiconductor 65, a source electrode 66, a drain electrode 67, a first gate electrode 68A, and a second gate electrode 68B. Detailed explanation of the second transistor Tr2 is omitted because it has a layer configuration similar to that of the first transistor Tr1. The drain electrode 67 of the second transistor Tr2 is coupled to coupling wiring 69 through a contact hole H8. The coupling wiring 69 is coupled to the first gate electrode 64A and the second gate electrode 64B of the first transistor Tr1.

While the semiconductor 65, the source electrode 66, the drain electrode 67, the first gate electrode 68A, and the second gate electrode 68B are provided to the same layers as those of the semiconductor 61, the source electrode 62, the drain electrode 63, the first gate electrode 64A, and the second gate electrode 64B, respectively, of the first transistor Tr1, they may be provided to different layers.

The transistor TrG includes a semiconductor 71, a source electrode 72, a drain electrode 73, a first gate electrode 74A, and a second gate electrode 74B. The transistor TrG is a switching element included in the drive circuits 12. Detailed explanation of the transistor TrG is omitted because it has a layer configuration similar to that of the first transistor Tr1. The third transistor Tr3 and the fourth transistor Tr4 (refer to FIG. 3) also have a layer configuration similar to that of the first transistor Tr1.

Figure 5:
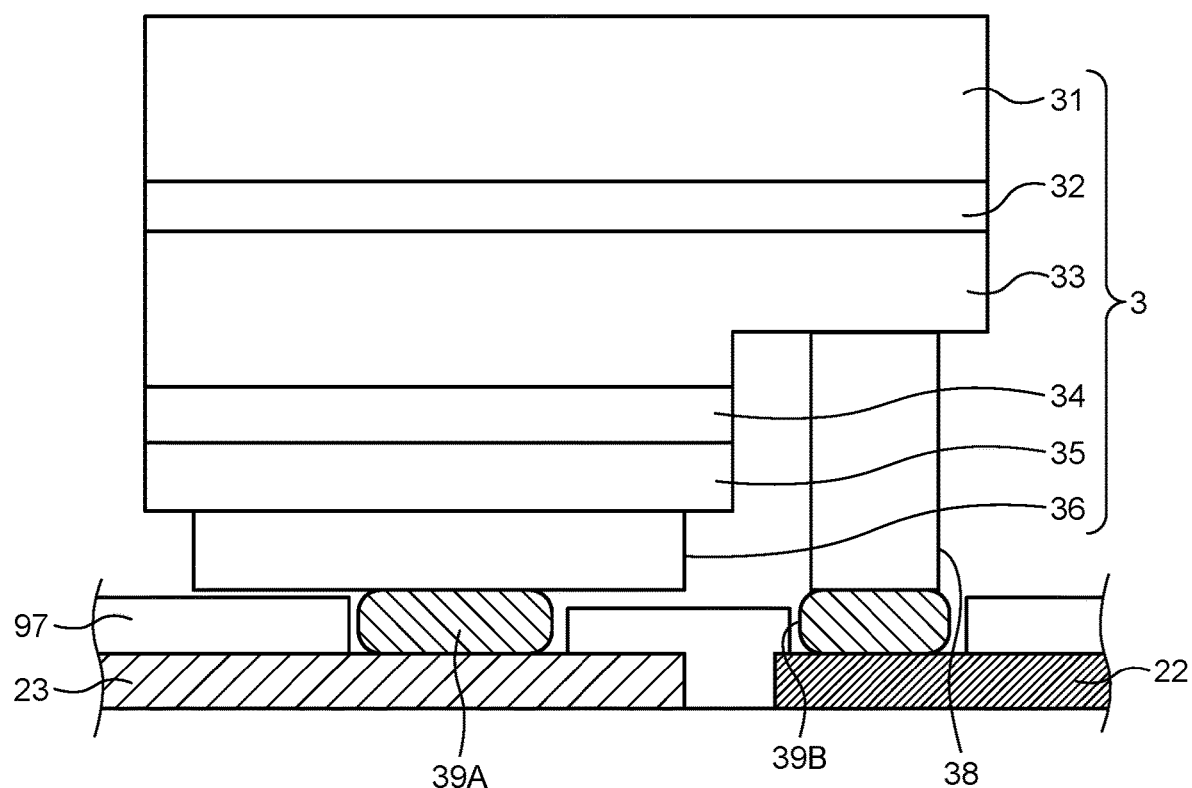
FIG. 5 is a sectional view of a light-emitting element according to the first embodiment.

The light-emitting element 3 is provided on the fifth insulating film 95 with a sixth insulating film 96 interposed therebetween. The light-emitting element 3 has what is called a face-down structure in which the anode and the cathode are provided on the lower side. The light-emitting element 3 may be a widely known LED chip. FIG. 5 is a sectional view of the light-emitting element according to the first embodiment. In the light-emitting element 3, as illustrated in FIG. 5, a buffer layer 32, an n-type cladding layer 33, an active layer 34, a p-type cladding layer 35, and a p-type electrode 36 are layered in order on a translucent substrate 31. In the light-emitting element 3, the translucent substrate 31 is provided on the upper side, and the p-type electrode 36 is provided on the lower side. The surface of the n-type cladding layer 33 facing a first electrode 22 has a region exposed from the active layer 34. This region is provided with an n-type electrode 38.

The p-type electrode 36 is made of material having metallic luster that reflects light from light-emitting layers. The p-type electrode 36 is coupled to the second electrode 23 with a bump 39A interposed therebetween. The n-type electrode 38 is coupled to the first electrode 22 with a bump 39B interposed therebetween.

The n-type cladding layer 33, the active layer 34, and the p-type cladding layer 35 are light-emitting layers and are made of a compound semiconductor, such as gallium nitride (GaN) and aluminum indium phosphorus (AlInP).

As illustrated in FIG. 4, the display device 1 further includes the first electrode 22, the second electrode 23, a third electrode 24, a fourth electrode 25, the flattening film 27, and an inorganic film 5. The first electrode 22 and the second electrode 23 are provided between the substrate 21 and the light-emitting element 3. The first electrode 22 is a cathode electrode coupled to the cathode of the light-emitting element 3. The first electrode 22 is provided on the sixth insulating film 96 and electrically coupled to the cathode wiring 26 provided in the peripheral region GA.

A second electrode 23 is an anode electrode coupled to the anode of the light-emitting element 3. The second electrode 23 is provided on the sixth insulating film 96 and coupled to a third electrode 24 through a contact hole H7. The third electrode 24 is provided on the fifth insulating film 95 and coupled to the drain electrode 63 through a contact hole H2. As described above, the second electrode 23 and the third electrode 24 couple the anode of the light-emitting element 3 and the drain electrode 63 of the first transistor Tr1. A fourth electrode 25 is provided to the same layer as that of the third electrode 24 and coupled to the source electrode 62 through a contact hole H4.

The fourth electrode 25 extends on the fifth insulating film 95 and faces the first electrode 22 with the sixth insulating film 96 interposed therebetween in the third direction Dz. With this configuration, capacitance is formed between the first electrode 22 and the fourth electrode 25. The capacitance formed between the first electrode 22 and the fourth electrode 25 is used as holding capacitance CS of a pixel circuit 28.

A seventh insulating film 97 is provided on the sixth insulating film 96 in a manner covering part of the first electrode 22 and the second electrode 23. The flattening film 27 is provided on the seventh insulating film 97 in a manner surrounding at least side surfaces 3a of the light-emitting element 3. The flattening film 27 is provided on the seventh insulating film 97 from the display region AA to the peripheral region GA. An upper surface 3b of the light-emitting element 3 is exposed from the flattening film 27 and is in contact with the inorganic film 5. The flattening film 27 is a translucent organic insulating film. The flattening film 27 is made of resin material, such as silicone resin, epoxy resin, acrylic rein, and polyimide resin.

The inorganic film 5 is provided covering the flattening film 27 and the light-emitting element 3 and is in contact with the upper surface 27a of the flattening film 27 and the upper surface 3b of the light-emitting element 3. The inorganic film 5 is a dense film that can prevent moisture from passing therethrough and is continuously formed with no through hole or opening. The inorganic film 5 is provided on the seventh insulating film 97 from the display region AA to the peripheral region GA. While one light-emitting element 3 is illustrated in FIG. 4, the inorganic film 5 is provided covering the whole region of the display region AA and part of the peripheral region GA. The inorganic film 5 covers the upper surfaces 3b of the light-emitting elements 3 provided to the respective pixels Pix.

The thickness of the inorganic film 5 is 50 nm or larger, and more preferably is 100 nm or larger. The thickness of the inorganic film 5 is approximately 200 nm, for example. The inorganic film 5 is a translucent inorganic insulating film and is made of inorganic material including one or more of silicon nitride ($SiN_x$), aluminum oxide ($Al_xO_y$), and aluminum oxynitride ($Al_xO_yN_z$) as a main component, for example. The inorganic film 5 is made of non-metal material. The inorganic film 5 may be a single-layered or multilayered film.

In the display device 1, the array substrate 2 includes the layers from the substrate 21 to the first electrode 22 and the second electrode 23. The array substrate 2 does not include the flattening film 27, the light-emitting element 3, or the inorganic film 5.

As described above, the display device 1 according to the present embodiment includes the substrate 21, a plurality of pixels Pix, the light-emitting elements 3 (inorganic light-emitting elements), the flattening film 27, and the inorganic film 5. The pixels Pix are arrayed on the substrate 21 and display different colors. The light-emitting elements 3 are provided to the respective pixels Pix. The flattening film 27 surrounds at least the side surfaces 3a of the light-emitting elements 3. The inorganic film 5 covers the flattening film 27 and the light-emitting elements 3.

With the inorganic film 5, the display device I can prevent moisture from entering from at least the upper surface 27a of the flattening film 27 and the upper surfaces 3b of the light-emitting elements 3. The display device 1 can prevent moisture from entering into the light-emitting elements 3 through the flattening film 27. As a result, the display device 1 can prevent various electrodes, such as the first electrode 22 and the second electrode 23, and various kinds of wiring from being corroded by moisture. Consequently, the display device 1 can prevent reduction in luminous efficiency of the light-emitting elements 3 due to entry of moisture and deterioration of display characteristics.

The display device 1 also includes the transistors (e.g., the first transistors Tr1 and the second transistors Tr2), the insulating layers (the fifth insulating film 95, the sixth insulating film 96, and the seventh insulating film 97), and the cathode wiring 26. The transistors are provided to the first surface of the substrate 21. The insulating layers cover the transistors. The cathode wiring 26 is provided to the first surface of the substrate 21 and electrically coupled to the cathodes of the light-emitting elements 3. The flattening film 27 and the inorganic film 5 are provided on the upper side of the insulating layers (the fifth insulating film 95, the sixth insulating film 96, and the seventh insulating film 97) from the display region AA provided with the light-emitting elements 3 to the peripheral region GA positioned outside the display region AA. With this configuration, the display device 1 can satisfactorily prevent moisture from entering into the light-emitting elements 3 because the inorganic film 5 is provided from the display region AA to the peripheral region GA.

The upper surfaces 3b of the light-emitting elements 3 are exposed from the flattening film 27 and are in contact with the inorganic film 5. With this configuration, the display device 1 can increase the extraction efficiency of light output from the light-emitting elements 3 because the flattening film 27 is not provided on the upper surfaces 3b of the light-emitting elements 3.

First Modification of the First Embodiment

Figure 6:
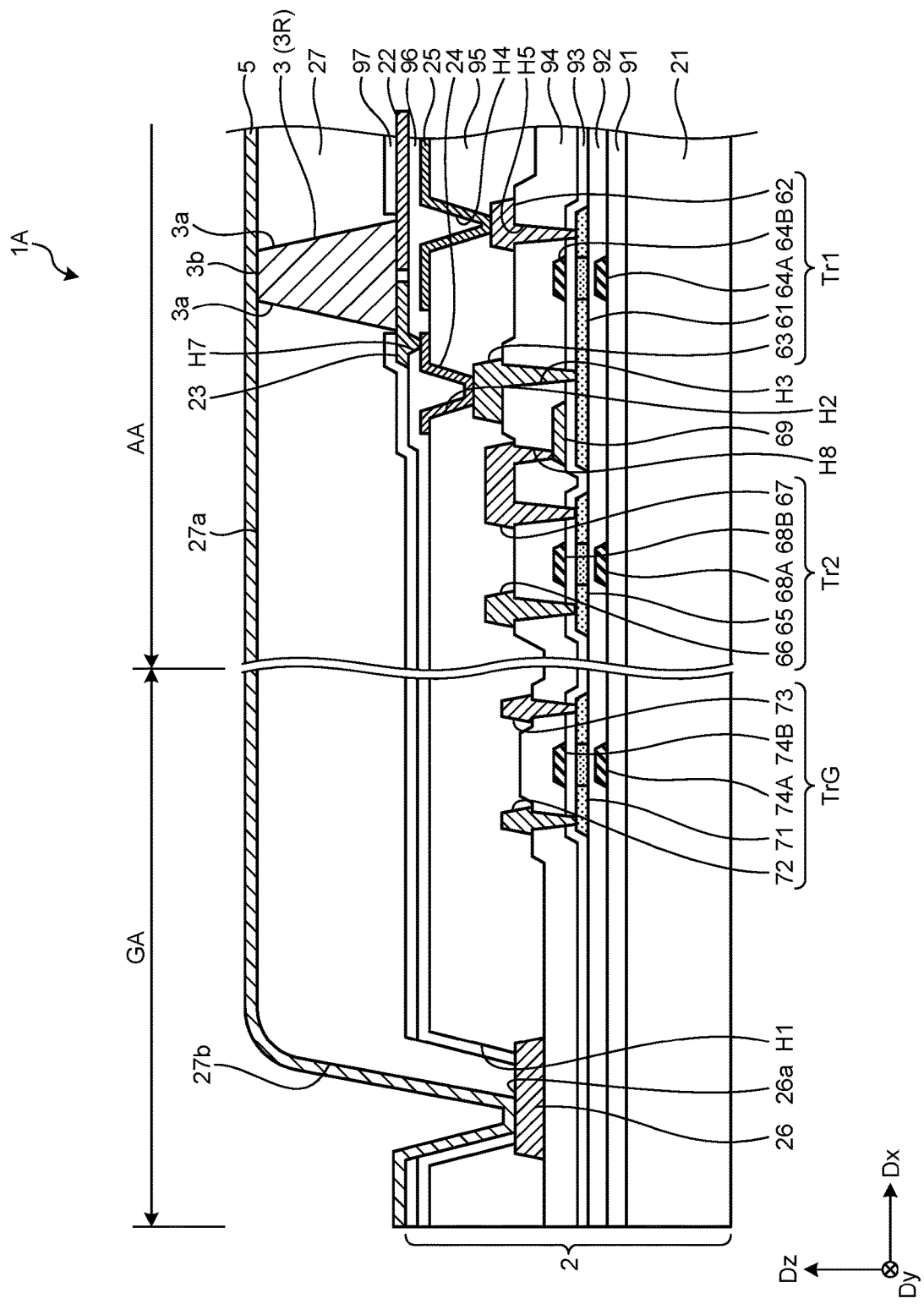
FIG. 6 is a sectional view of the display device according to a first modification of the first embodiment.

FIG. 6 is a sectional view of the display device according to a first modification of the first embodiment. In the following description, the components described in the embodiment above are denoted by like reference numerals, and explanation thereof is omitted.

As illustrated in FIG. 6, a display device 1A according to the present modification has a contact hole H1 in the fifth insulating film 95. An upper surface 26a of the cathode wiring 26 is exposed at the bottom of the contact hole H1. The flattening film 27 is not only provided on the seventh insulating film 97 but also provided covering part of the cathode wiring 26 in the contact hole H1. A side surface 27b of the flattening film 27 is in contact with the cathode wiring 26. The upper surface 26a of the cathode wiring 26 is exposed from the flattening film 27 on the side closer to the outer periphery of the substrate 21 than the part at which the side surface 27b of the flattening film 27 is in contact with the cathode wiring 26. In other words, the flattening film 27 is not provided on the side closer to the outer periphery of the substrate 21 than the part at which the side surface 27b of the flattening film 27 is in contact with the cathode wiring 26.

The inorganic film 5 is continuously provided covering the upper surface 27a and the side surface 27b of the flattening film 27. The inorganic film 5 is in contact with the upper surface 26a of the cathode wiring 26 at the bottom of the contact hole H1. The inorganic film 5 is in contact with the sixth insulating film 96 on the side surface of the contact hole H1. The inorganic film 5 extends toward the side closer to the outer periphery of the substrate 21 than the contact hole H1 and is provided on the seventh insulating film 97.

The inorganic film 5 according to the present modification covers the upper surface 27a and the side surface 27b of the flattening film 27 and is in contact with the upper surface 26a of the cathode wiring 26 at the bottom of the contact hole H1. With this configuration, the inorganic film 5 can prevent moisture from entering from the upper surface 27a and the side surface 27b of the flattening film 27 because the side surface 27b of the flattening film 27 is not exposed.

Consequently, the display device 1A can prevent moisture from entering into the light-emitting elements 3 through the flattening film 27.

Second Modification of the First Embodiment

Figure 7:
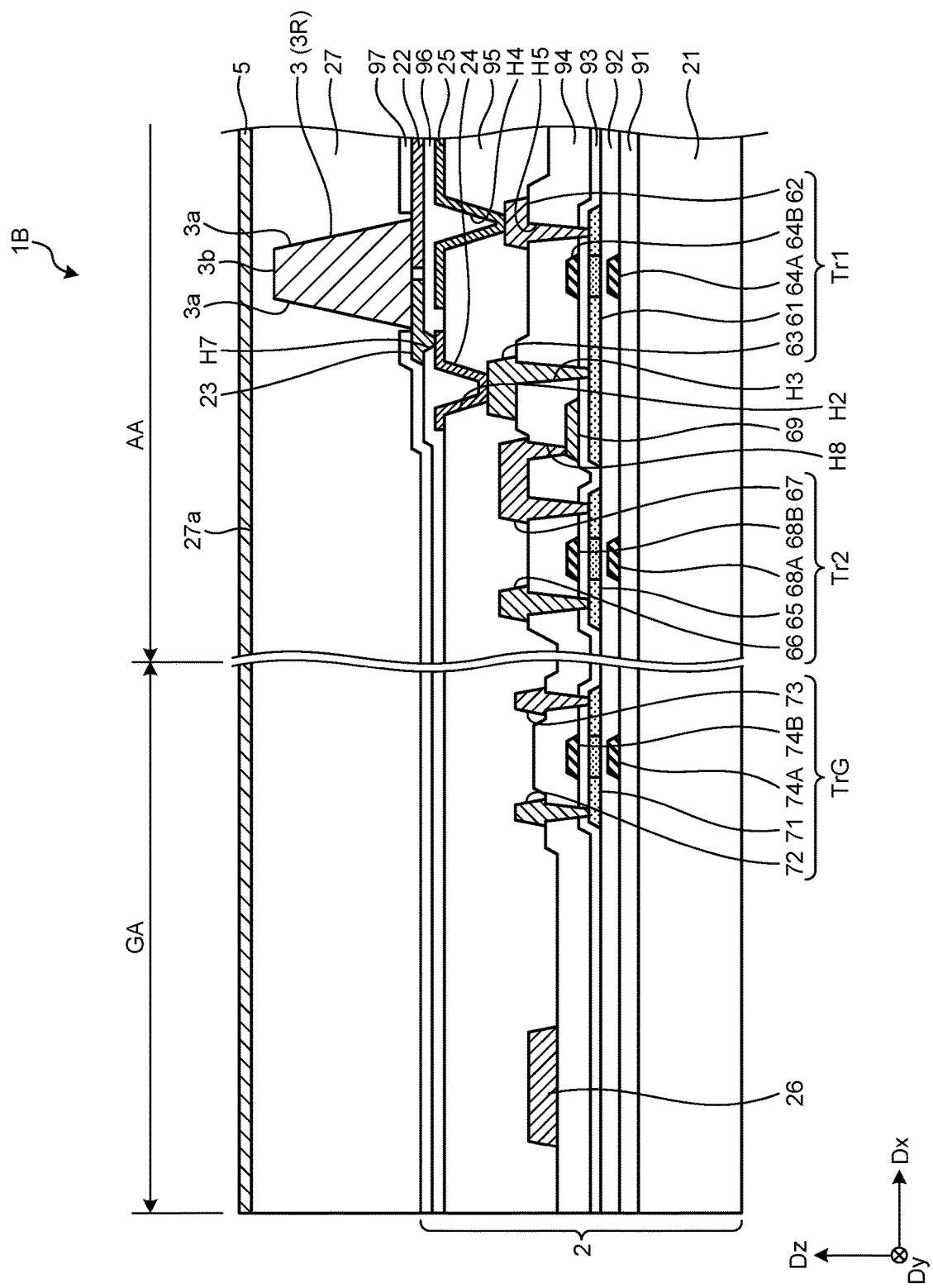
FIG. 7 is a sectional view of the display device according to a second modification of the first embodiment.

FIG. 7 is a sectional view of the display device according to a second modification of the first embodiment. As illustrated in FIG. 7, the flattening film 27 of a display device 1B according to the present modification is provided covering the side surfaces 3a and the upper surface 3b of the light-emitting element 3. The inorganic film 5 is provided on the upper surface 27a of the flattening film 27 to cover the light-emitting element 3. In the third direction Dz, the flattening film 27 is provided between the upper surface 3b of the light-emitting element 3 and the inorganic film 5.

In the present modification, the thickness of the flattening film 27 is larger than the height of the light-emitting element 3. In the display device 1B, the thickness of the flattening film 27 need not be equal to the height of the light-emitting element 3, thereby reducing the restrictions on the flattening film 27 due to the height of the light-emitting element 3. Consequently, the flattening film 27 of the display device 1B can be manufactured at a lower cost. If an LED chip is used in which the first light-emitting element 3R, the second light-emitting element 3G, and the third light-emitting element 3B have different heights, for example, the flattening film 27 can be manufactured in a simpler manner.

Second Embodiment

Figure 8:
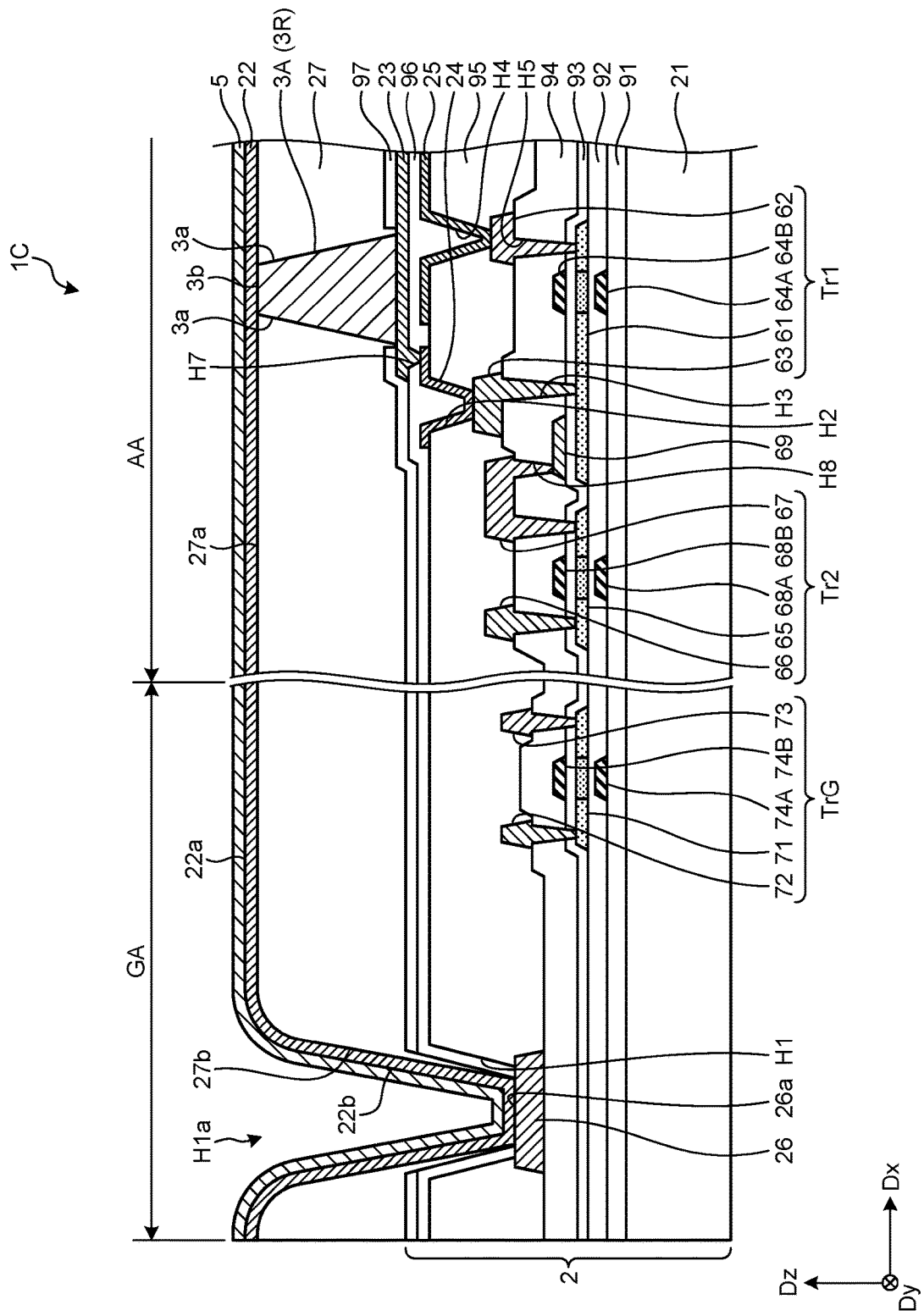
FIG. 8 is a sectional view of the display device according to a second embodiment.
Figure 9:
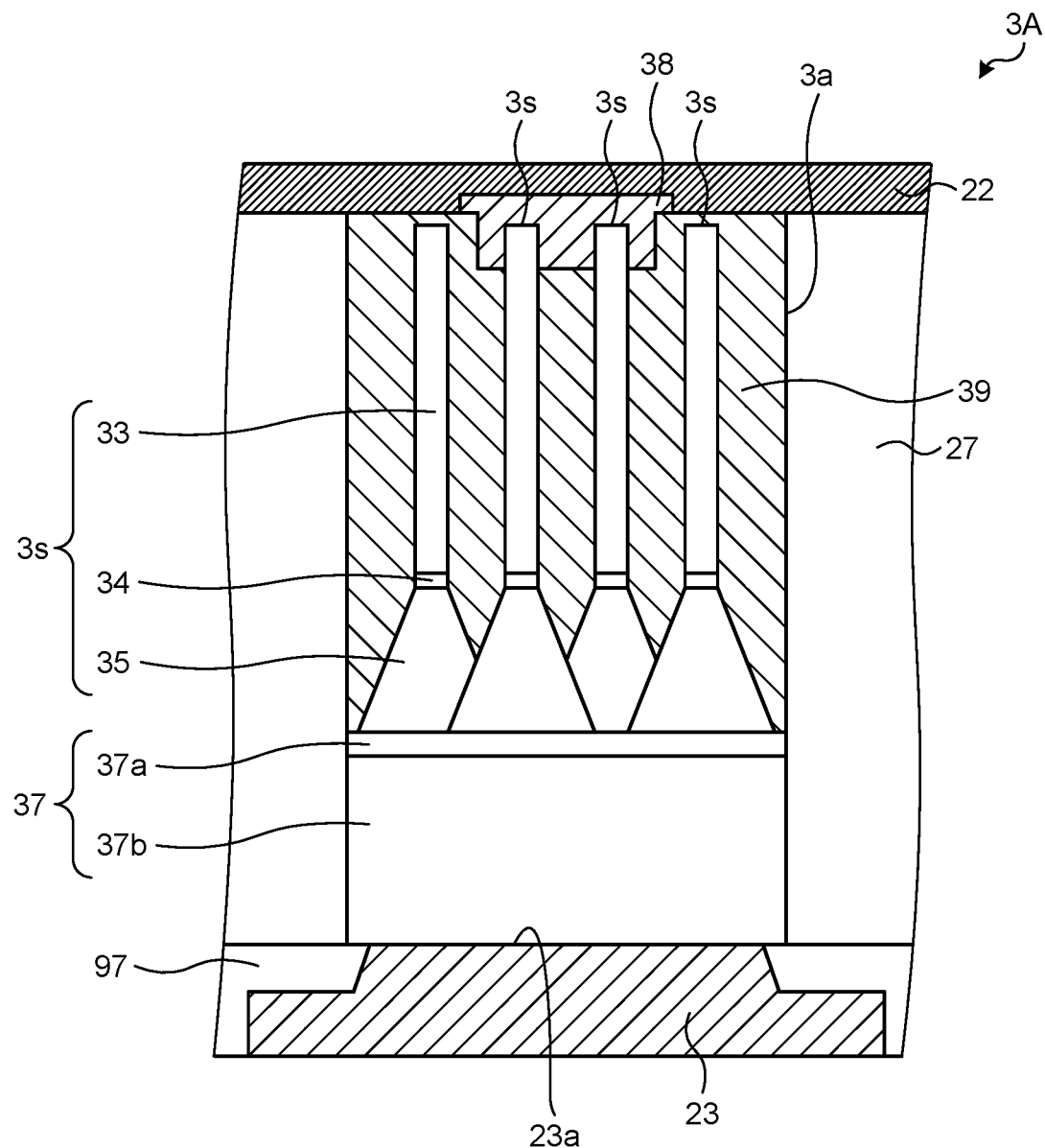
FIG. 9 is a sectional view of the light-emitting element according to the second embodiment.

FIG. 8 is a sectional view of the display device according to a second embodiment. FIG. 9 is a sectional view of the light-emitting element according to the second embodiment. In a display device 1C according to the present embodiment, a light-emitting element 3A has what is called a face-up structure in which the anode is provided on the lower side and the cathode is provided on the upper side.

As illustrated in FIG. 9, the light-emitting element 3A includes a plurality of partial light-emitting elements 3s, a protective layer 39, a p-type electrode 37, and an n-type electrode 38. The protective layer 39 covers the partial light-emitting elements 3s. The partial light-emitting elements 3s have a columnar shape and are provided between the p-type electrode 37 and the n-type electrode 38. The partial light-emitting elements 3s each include an n-type cladding layer 33, an active layer 34, and a p-type cladding layer 35.

The n-type electrode 38 is electrically coupled to the n-type cladding layer 33. The p-type electrode 37 is electrically coupled to the p-type cladding layer 35. The p-type cladding layer 35, the active layer 34, and the n-type cladding layer 33 are layered in order on the p-type electrode 37.

The n-type electrode 38 is made of translucent conductive material, such as indium tin oxide (ITO). The n-type electrode 38 serves as the cathode of the light-emitting element 3A and is coupled to the first electrode 22. The p-type electrode 37 serves as the anode of the light-emitting element 3A and includes a Pt layer 37a and a thick Au layer 37b produced by plating. The thick Au layer 37b is coupled to a placement surface 23a of the second electrode 23.

The protective layer 39 is a spin on glass (SOG), for example. The side surfaces of the protective layer 39 correspond to the side surfaces 3a of the light-emitting element 3A. The flattening film 27 is provided surrounding the side surfaces of the protective layer 39.

As illustrated in FIG. 8, the second electrode 23 is provided between the substrate 21 and the light-emitting element 3A. Specifically, the second electrode 23 is provided on the sixth insulating film 96 and coupled to the third electrode 24 through a contact hole H7. The fourth electrode 25 extends on the fifth insulating film 95 and faces the second electrode 23 with the sixth insulating film 96 interposed therebetween in the third direction Dz. With this configuration, capacitance is formed between the second electrode 23 and the fourth electrode 25.

The first electrode 22 is coupled to the cathode of the light-emitting element 3A and provided on the light-emitting element 3A and the flattening film 27. The first electrode 22 is provided from the display region AA to the peripheral region GA and provided along the upper surface 27a and the side surface 27b of the flattening film 27. The flattening film 27 has a contact hole H1a at a position overlapping the contact hole H1. The upper surface 26a of the cathode wiring 26 is exposed from the flattening film 27 at the bottom of the contact holes H1 and H1a. The first electrode 22 is in contact with the upper surface 26a of the cathode wiring 26 at the bottom of the contact holes H1 and H1a. The first electrode 22 according to the present embodiment is made of translucent conductive material, such as ITO.

The inorganic film 5 is provided on the first electrode 22. Specifically, the inorganic film 5 covers an upper surface 22a and a side surface 22b of the first electrode 22. In other words, the first electrode 22 is provided between the inorganic film 5 and the upper surface 27a of the flattening film 27 and between the inorganic film 5 and the side surface 27b of the flattening film 27. At the bottom of the contact hole H1a, the first electrode 22 and the inorganic film 5 are layered in order on the cathode wiring 26.

Figure 10:
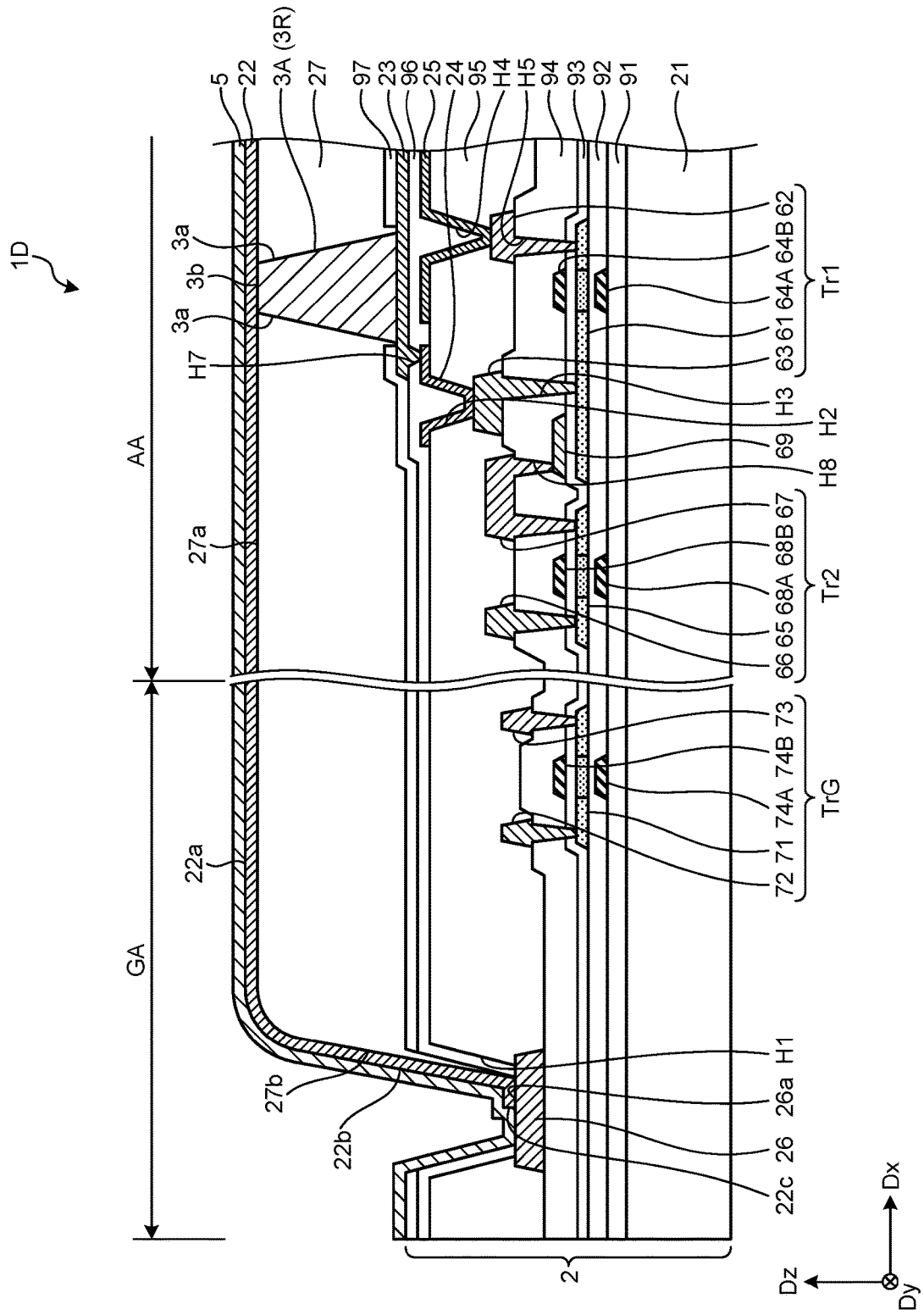
FIG. 10 is a sectional view of the display device according to a modification of the second embodiment.

The inorganic film 5 is less hygroscopic than the first electrode 22 made of ITO, for example, and can prevent moisture from passing therethrough. Also in the configuration where the first electrode 22 is provided on the flattening film 27 as illustrated in FIG. 8, the display device 1C can prevent moisture from passing through the first electrode 22 and the flattening film 27 and entering into the light-emitting elements 3. Modification of the second embodiment FIG. 10 is a sectional view of the display device according to a modification of the second embodiment. In a display device 1D according to the present modification, the first electrode 22 is in contact with the upper surface 26a of the cathode wiring 26 at the bottom of the contact hole H1. An end 22c of the first electrode 22 is provided at a position overlapping the upper surface 26a of the cathode wiring 26. In other words, the upper surface 26a of the cathode wiring 26 is exposed from the first electrode 22 on the side closer to the outer periphery of the substrate 21 than the part at which the end 22c of the first electrode 22 is in contact with the cathode wiring 26.

The inorganic film 5 covers the upper surface 22a and the side surface 22b of the first electrode 22. The inorganic film 5 covers the end 22c of the first electrode 22 and is in contact with the upper surface 26a of the cathode wiring 26 at the bottom of the contact hole H1.

With this configuration, the part at which the first electrode 22 is in contact with the cathode wiring 26 and the part at which the first electrode 22 is in contact with the flattening film 27 are covered with the inorganic film 5 and are not exposed outside. With the inorganic film 5 that blocks a path through which moisture enters from the outside, the display device 1D can prevent moisture from passing through the first electrodes 22 and the flattening film 27 and entering into the light-emitting elements 3.

Third Embodiment

Figure 11:
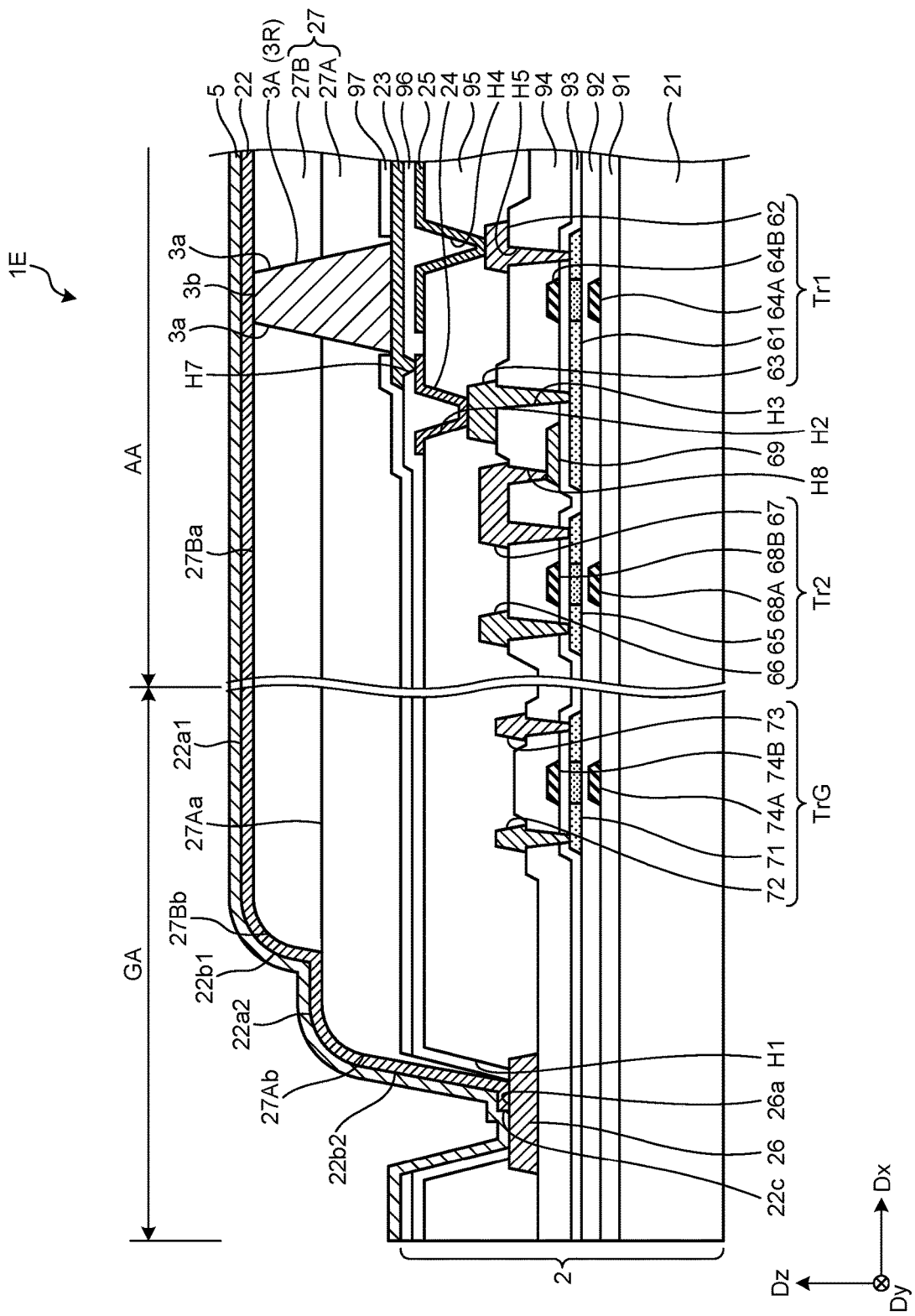
FIG. 11 is a sectional view of the display device according to a third embodiment.

FIG. 11 is a sectional view of the display device according to a third embodiment. In a display device 1E according to the present embodiment, the flattening film 27 includes a first flattening film 27A and a second flattening film 27B provided on the first flattening film 27A. The first flattening film 27A and the second flattening film 27B are provided surrounding the side surfaces 3a of the light-emitting element 3. The upper surface 3b of the light-emitting element 3 is exposed from an upper surface 27Ba of the second flattening film 27B.

The first flattening film 27A is provided from the display region AA to the peripheral region GA, and a side surface 27Ab of the first flattening film 27A is provided in the contact hole H1. A side surface 27Bb of the second flattening film 27B is provided at a position overlapping an upper surface 27Aa of the first flattening film 27A. In other words, the side surface 27Bb of the second flattening film 27B is provided at a position closer to the display region AA than the side surface 27Ab of the first flattening film 27A is. With this configuration, a step is formed by the upper surface 27Ba and the side surface 27Bb of the second flattening film 27B and the upper surface 27Aa of the part of the first flattening film 27A not provided with the second flattening film 27B. A step is also formed by the upper surface 27Aa and the side surface 27Ab of the first flattening film 27A and the upper surface 26a of the cathode wiring 26.

The first electrode 22 is provided covering the first flattening film 27A, the second flattening film 27B, and the light-emitting element 3. Specifically, the first electrode 22 covers the upper surface 27Ba and the side surface 27Bb of the second flattening film 27B and the upper surface 27Aa of the part of the first flattening film 27A not provided with the second flattening film 27B and the side surface 27Ab. As described above, the first electrode 22 is provided along the steps formed by the first flattening film 27A and the second flattening film 27B.

The inorganic film 5 covers a first upper surface 22a1, a first side surface 22b1, a second upper surface 22a2, and a second side surface 22b2 of the first electrode 22. The first upper surface 22a1 is a part extending along the upper surface 27Ba of the second flattening film 27B. The first side surface 22b1 is a part extending along the side surface 27Bb of the second flattening film 27B. The second upper surface 22a2 is a part extending along the upper surface 27Aa of the part of the first flattening film 27A not provided with the second flattening film 27B. The second side surface 22b2 is a part extending along the side surface 27Ab of the first flattening film 27A. The inorganic film 5 covers the end 22c of the first electrode 22 and is in contact with the upper surface 26a of the cathode wiring 26 at the bottom of the contact hole H1.

The display device 1E according to the present embodiment includes the first flattening film 27A and the second flattening film 27B and has a plurality of steps. In the display device 1E, the heights of the respective steps can be made smaller than that of one step corresponding to the height of the light-emitting element 3A. If the height of the light-emitting element 3A is approximately 5 μm to 10 μm, for example, the display device 1E can prevent generation of cracks and step disconnection in the first electrode 22 and the inorganic film 5.

The flattening film 27 may include three or more layers. The configuration according to the present embodiment can be applied to the display devices 1, 1A, and 1B according to the first embodiment. In this case, the inorganic film 5 is provided in contact with the upper surface 27Ba and the side surface 27Bb of the second flattening film 27B and the upper surface 27Aa of the part of the first flattening film 27A not provided with the second flattening film 27B and the side surface 27Ab. The configuration according to the present embodiment can also be applied to display devices 1F and 1G according to a fourth embodiment.

Fourth Embodiment

Figure 12:
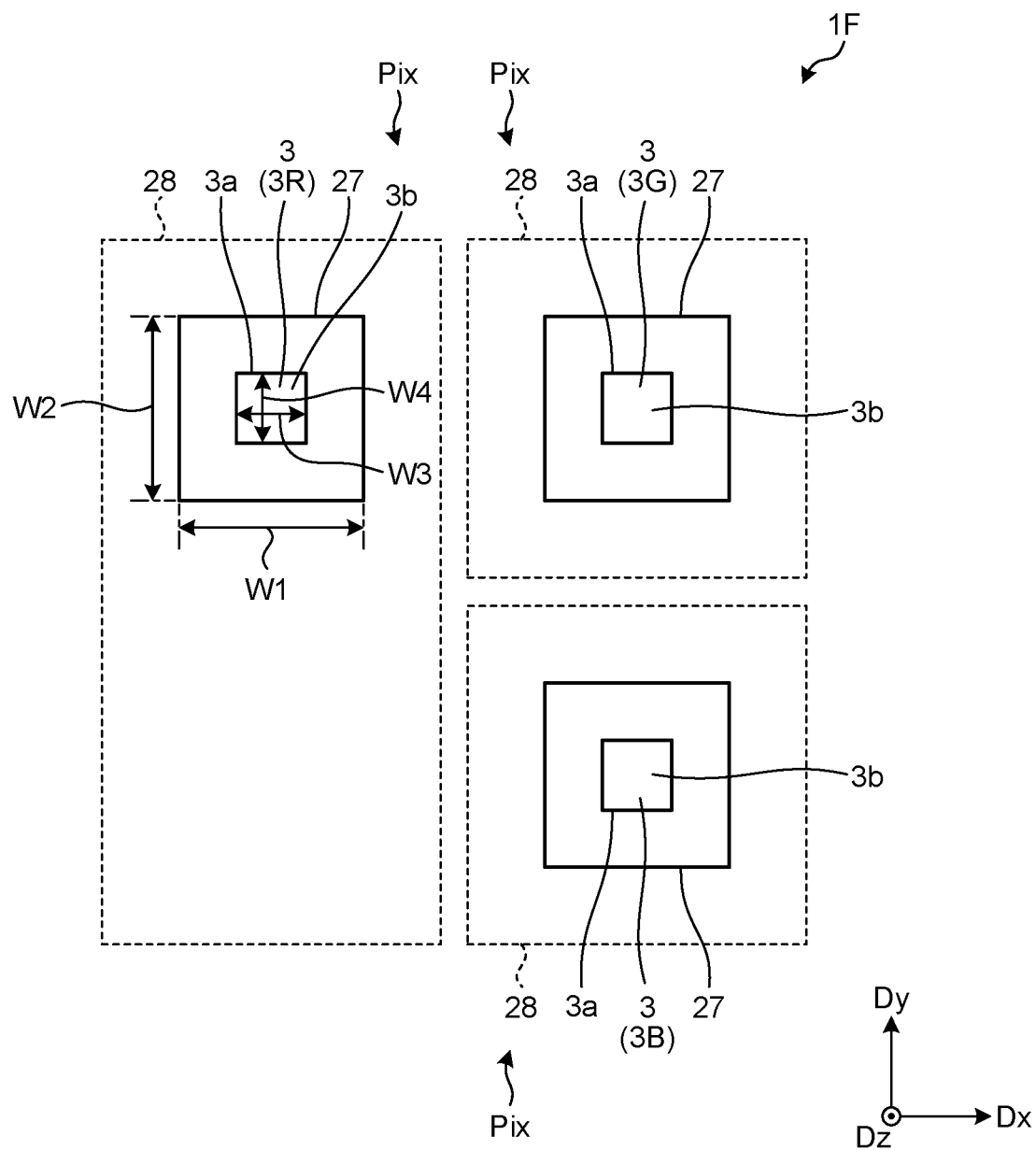
FIG. 12 is a plan view of a plurality of pixels of the display device according to a fourth embodiment.
Figure 13:
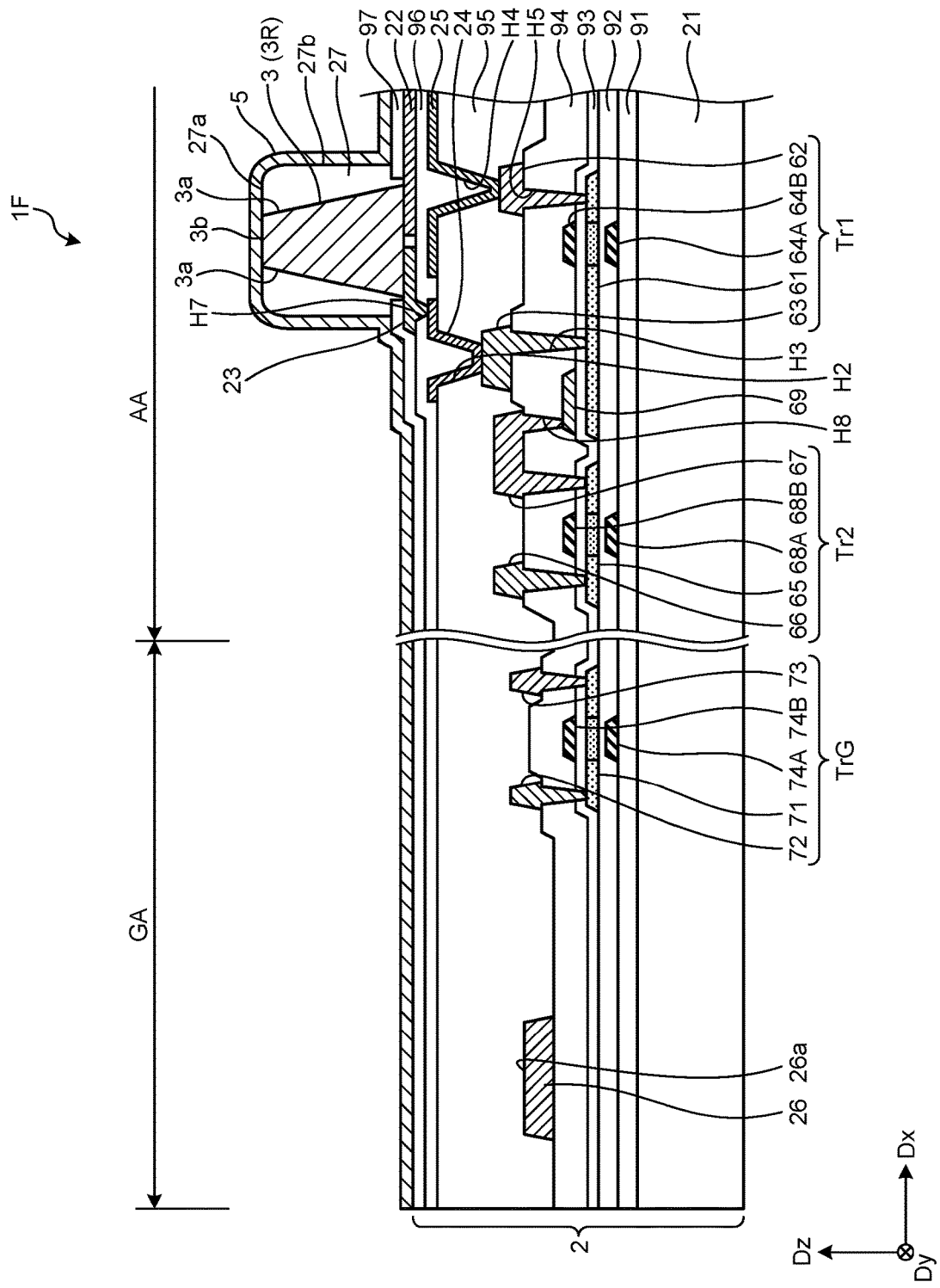
FIG. 13 is a sectional view of the display device according to the fourth embodiment.

FIG. 12 is a plan view of a plurality of pixels of the display device according to a fourth embodiment. FIG. 13 is a sectional view of the display device according to the fourth embodiment. To simplify the drawing, FIG. 12 does not illustrate the inorganic film 5.

As illustrated in FIG. 12, in a display device IF according to the present embodiment, the pixel Pix including the second light-emitting element 3G and the pixel Pix including the third light-emitting element 3B are disposed side by side in the second direction Dy. The two pixels Pix disposed side by side in the second direction Dy are disposed side by side with one pixel Pix including the first light-emitting element 3R in the first direction Dx. In this case, the first light-emitting element 3R and the second light-emitting element 3G are disposed side by side in the first direction Dx. The second light-emitting element 3G and the third light-emitting element 3B are disposed side by side in the second direction Dy. The first light-emitting element 3R may be disposed side by side with the third light-emitting element 3B in the first direction Dx.

A plurality of flattening films 27 are provided to the respective light-emitting elements 3. The flattening films 27 each surround the side surfaces 3a of the first light-emitting element 3R, the side surfaces 3a of the second light-emitting element 3G, or the side surfaces 3a of the third light-emitting element 3B. The flattening film 27 surrounding the first light-emitting element 3R is separated from the flattening film 27 surrounding the second light-emitting element 3G in the first direction Dx. The flattening film 27 surrounding the third light-emitting element 3B is separated from the flattening film 27 surrounding the second light-emitting element 3G in the second direction Dy. The flattening film 27 surrounding the first light-emitting element 3R is separated from the flattening film 27 surrounding the third light-emitting element 3B in the first direction Dx and the second direction Dy. The flattening films 27 can be applied and formed by ink-jet printing, for example.

A width W1 of the flattening film 27 in the first direction Dx is larger than a width W3 of the light-emitting element 3 in the first direction Dx in planar view. A width W2 of the flattening film 27 in the second direction Dy is larger than a width W4 of the light-emitting element 3 in the second direction Dy.

As illustrated in FIG. 13, the light-emitting element 3 according to the present embodiment has a face-down structure. The flattening film 27 is provided surrounding the side surfaces 3a of the light-emitting element 3 and overlapping part of the seventh insulating film 97. The upper surface 3b of the light-emitting element 3 is exposed from the flattening film 27. The inorganic film 5 covers the upper surface 27a and the side surfaces 27b of the flattening film 27 and the upper surface 3b of the light-emitting element 3 and is provided on the seventh insulating film 97 exposed from the flattening film 27. The inorganic film 5 is provided surrounding the side surfaces 27b of the flattening film 27. The inorganic film 5 extends from the display region AA to the peripheral region GA. The inorganic film 5 is provided between the light-emitting elements 3 and between the flattening films 27 illustrated in FIG. 12.

In the display device IF according to the present embodiment, the flattening films 27 are provided to the respective light-emitting elements 3. With this configuration, the region provided with no light-emitting element 3 has higher light transmittance. The display device IF can be used for what is called a transparent display including a translucent display device through which the opposite side of the screen can be seen.

The array of the pixels Pix illustrated in FIG. 12 is given by way of example only, and the present embodiment can be applied to the array of the pixels Pix illustrated in FIG. 2.

Modification of the Fourth Embodiment

Figure 14:
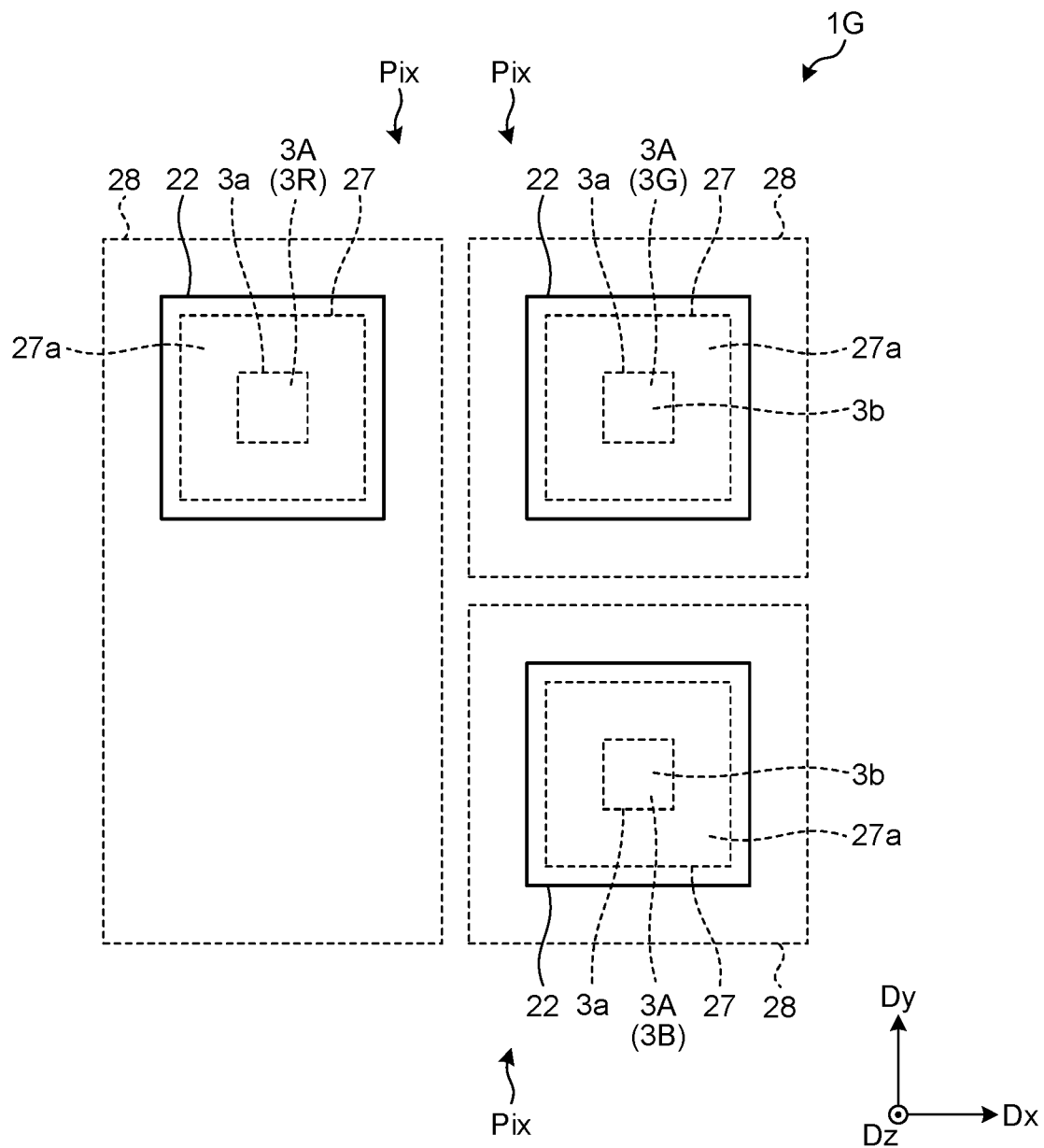
FIG. 14 is a plan view of a plurality of pixels of the display device according to a modification of the fourth embodiment.
Figure 15:
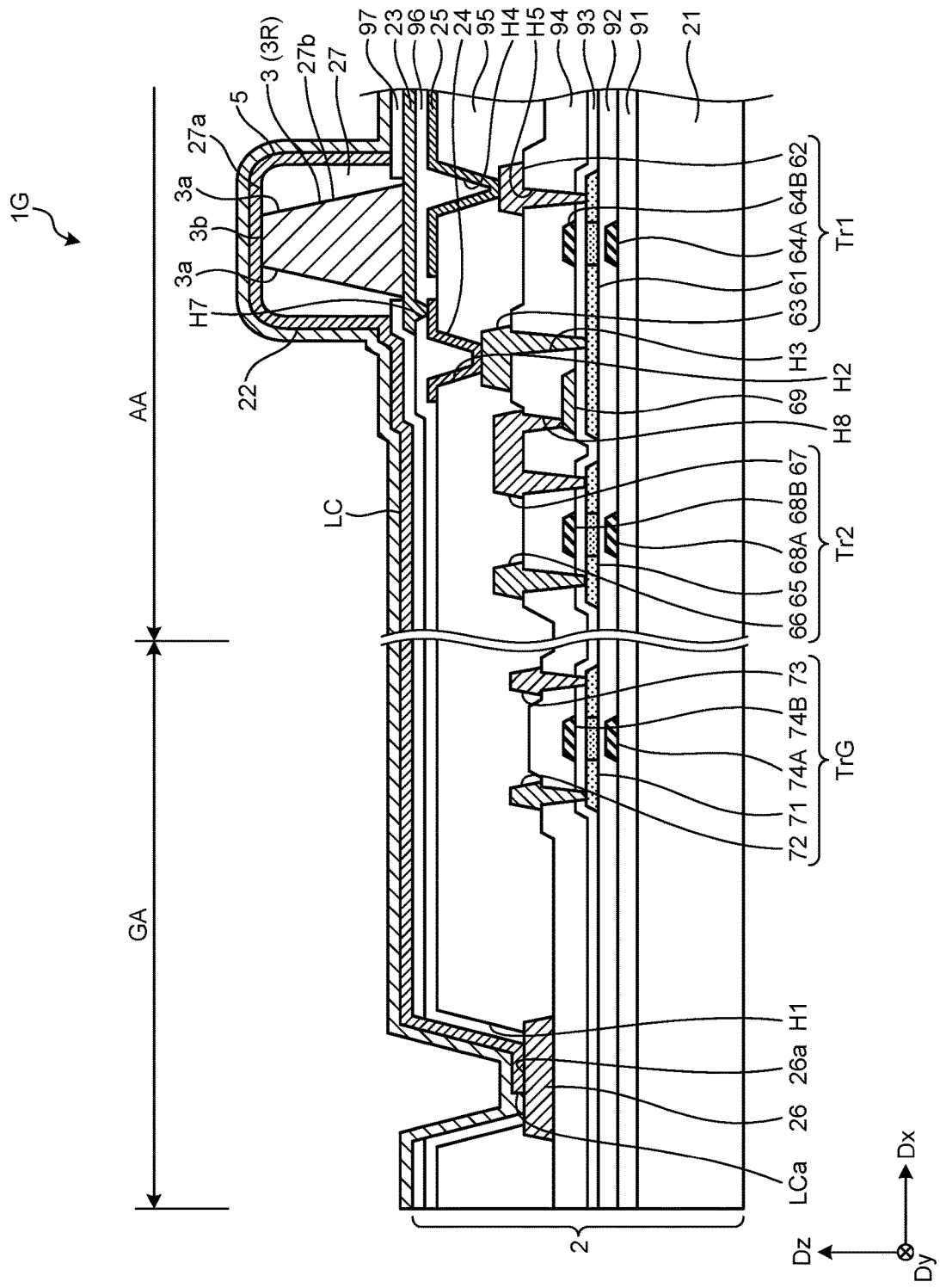
FIG. 15 is a sectional view of the display device according to the modification of the fourth embodiment.

FIG. 14 is a plan view of a plurality of pixels of the display device according to a modification of the fourth embodiment. FIG. 15 is a sectional view of the display device according to the modification of the fourth embodiment.

In a display device 1G according to the present modification, the light-emitting element 3 has a face-up structure. As illustrated in FIGS. 14 and 15, the first electrode 22 is provided covering the upper surface 27a and the side surfaces 27b of the flattening film 27 and the upper surface 3b of the light-emitting element 3. As illustrated in FIG. 14, the first electrodes 22 are provided to the respective light-emitting elements 3 and are each provided on the light-emitting element 3 and the flattening film 27. The first electrode 22 is provided covering the whole upper surface 27a of the flattening film 27. The first electrode 22 may be provided to part of the upper surface 27a of the flattening film 27 or part of the side surfaces 27b.

As illustrated in FIG. 15, the first electrodes 22 are each coupled to the cathode of the corresponding light-emitting element 3 and to cathode coupling wiring LC provided on the seventh insulating film 97. The cathode coupling wiring LC extends from the display region AA to the peripheral region GA and is coupled to the cathode wiring 26 exposed at the bottom of the contact hole H1.

The inorganic film 5 is provided covering the upper surfaces and the side surfaces of the first electrodes 22. The inorganic film 5 is provided surrounding the side surfaces of the first electrodes 22. The inorganic film 5 is provided on the seventh insulating film 97 in a manner covering the cathode coupling wiring LC. The inorganic film 5 is provided from the display region AA to the peripheral region GA. The inorganic film 5 covers an end LCa of the cathode coupling wiring LC and is in contact with the cathode wiring 26 at the bottom of the contact hole H1.

With this configuration, the part at which the cathode coupling wiring LC is in contact with the cathode wiring 26 and the part at which the first electrode 22 is in contact with the flattening film 27 are covered with the inorganic film 5 and are not exposed outside. With the inorganic film 5 that blocks a path through which moisture enters from the outside, the display device 1G can prevent moisture from entering into the light-emitting elements 3.

While exemplary embodiments according to the present disclosure have been described, the embodiments are not intended to limit the disclosure. The contents disclosed in the embodiments are given by way of example only, and various changes may be made without departing from the spirit of the present disclosure. Appropriate changes made without departing from the spirit of the present disclosure naturally fall within the technical scope of the disclosure. At least one of various omissions, substitutions, and changes of the components may be made without departing from the gist of the embodiments above and the modifications thereof.

What is claimed is:

1. A display device comprising:
   a substrate;
   a first flattening film on the substrate;
   an anode electrode on the first flattening film;
   an inorganic light-emitting element including an anode and a cathode;
   a cathode wiring between the substrate and the first flattening film;
   a second flattening film that surrounds a side surface of the light emitting element, on the first flattening film;
   a cathode electrode on the second flattening film; and
   an inorganic film on the cathode electrode,
   wherein
   the anode of the inorganic light-emitting element is disposed on the anode electrode,
   the cathode electrode is provided between the second flattening film and the inorganic film,
   the cathode of the inorganic light-emitting element is connected to the cathode electrode,
   the cathode electrode is connected to the cathode wiring via a contact hole formed in the first flattening film and the second flattening film, and
   the inorganic film that has a constant thickness in a first direction perpendicular to the substrate is in contact with the cathode electrode in the contact hole.

2. The display device of claim 1, wherein the inorganic film covers a side surface of the contact hole.

3. The display device of claim 1, wherein
   a part of the cathode wiring is exposed form the cathode electrode in the contact hole, and
   the inorganic film is in contact with the part of the cathode wiring in the contact hole.

4. The display device of claim 1, further comprising a transistor, wherein
   the transistor is provided between the substrate and the first flattening film, and
   the anode electrode is connected to the transistor.

5. The display device of claim 1, wherein
   the contact hole is disposed in the first flattening film and has a side facing a side surface of the second flattening film, and
   in a sectional view, part of a side of the contact hole faces the second flattening film and other part of the side of the contact hole does not face the second flattening film.

6. The display device of claim 5, wherein
   the cathode electrode covers a part of the contact hole in the first flattening film, and
   other part of the contact hole in the first flattening film is exposed from the cathode electrode.

7. The display device of claim 6, wherein
   a part of the cathode wiring is exposed form the cathode electrode in the other part of the contact hole in the first flattening film, and
   the inorganic film is in contact with the part of the cathode wiring in the other part of the contact hole in the first flattening film.

8. The display device of claim 7, wherein the side surface of the second flattening film has a plurality of steps.

* * * * *